US005249340A

United States Patent [19]

Kane et al.

[11] Patent Number: 5,249,340

[45] Date of Patent: Oct. 5, 1993

[54] FIELD EMISSION DEVICE EMPLOYING A SELECTIVE ELECTRODE DEPOSITION METHOD

[75] Inventors: Robert C. Kane, Woodstock, Ill.; Scott K. Ageno, Scottsdale, Ariz.

[73] Assignee: Motorola, Inc., Schaumburg, Ill.

[21] Appl. No.: 720,113

[22] Filed: Jun. 24, 1991

[51] Int. Cl.[5] .................... B23B 5/28; H01L 21/302

[52] U.S. Cl. .................... 29/25.02; 437/203; 445/50

[58] Field of Search .................... 437/203; 445/49, 50, 445/51; 313/308, 309, 310, 313, 311, 315, 316, 336; 357/51, 71; 29/25.01, 25.02

[56] References Cited

U.S. PATENT DOCUMENTS

| | | | |
|---|---|---|---|
| 3,755,704 | 8/1973 | Spindt et al. | 313/309 |
| 3,812,559 | 5/1972 | Spindt et al. | 313/309 |
| 4,324,999 | 4/1982 | Wolfe | 313/336 |
| 4,663,559 | 5/1987 | Christensen | 313/310 |
| 4,835,438 | 5/1989 | Baptist et al. | 313/336 |
| 5,064,396 | 11/1991 | Spindt | 313/336 |
| 5,087,591 | 2/1992 | Teng | 156/643 |
| 5,136,764 | 8/1992 | Vasquez | 437/228 |

*Primary Examiner*—Olik Chaudhuri
*Assistant Examiner*—Ken Horton
*Attorney, Agent, or Firm*—Eugene A. Parsons

[57] ABSTRACT

A method of forming a field emission device including the steps of selective deposition of a column/ridge within the confines of a conformally deposited insulator layer and subsequent directional deposition to form a cone/wedge, having a geometric discontinuity of small radius of curvature, on the column/ridge is provided.

9 Claims, 7 Drawing Sheets

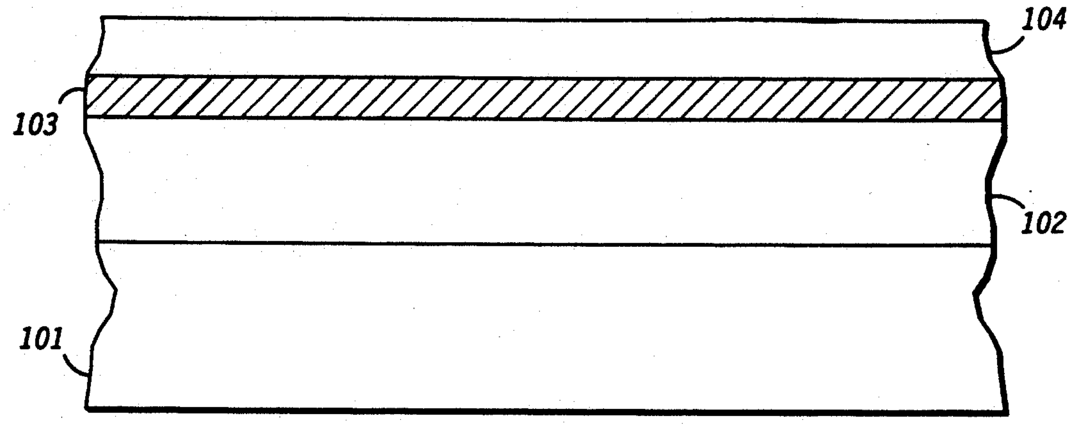
100 Fig. 1A
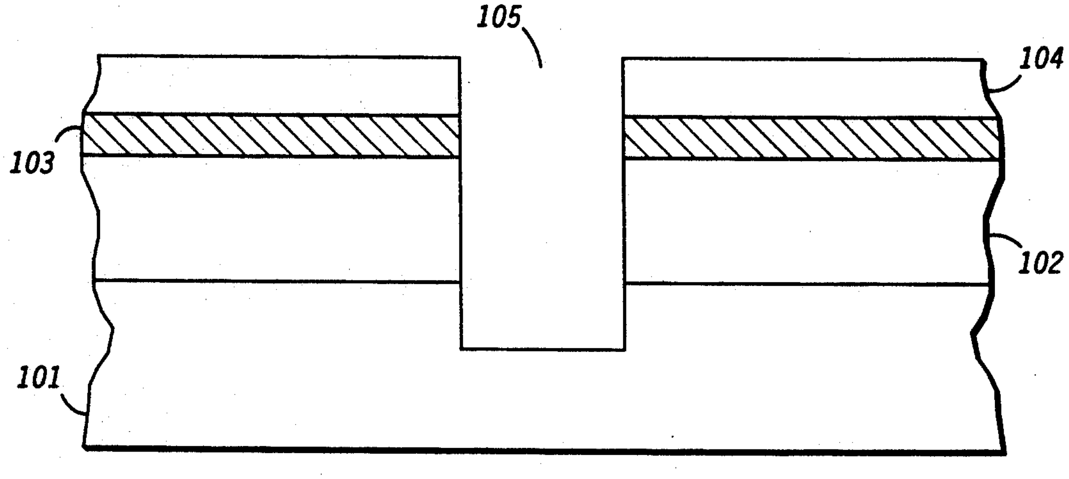
Fig. 1B 100
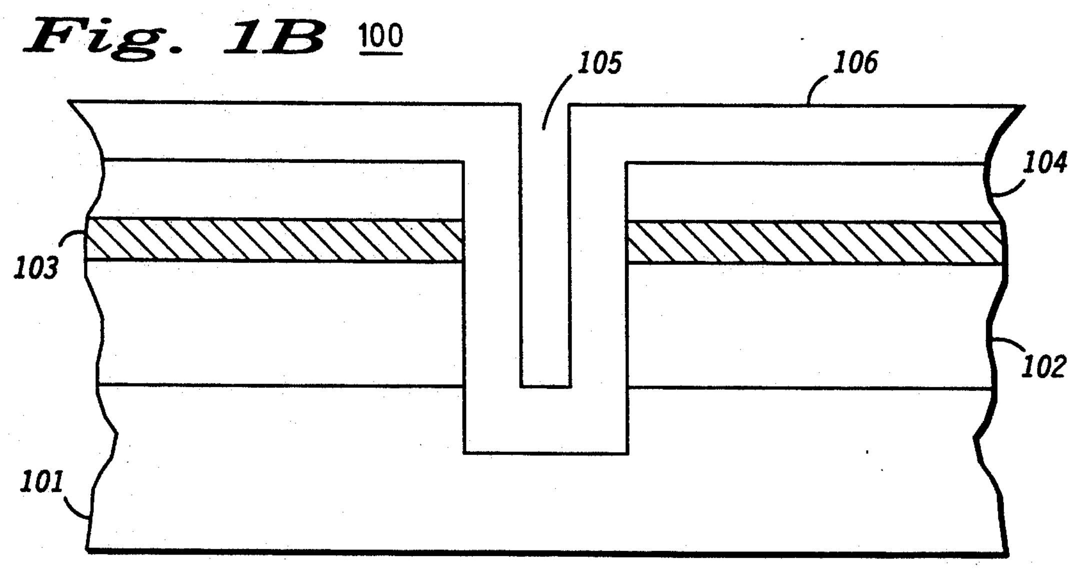
100 Fig. 1C

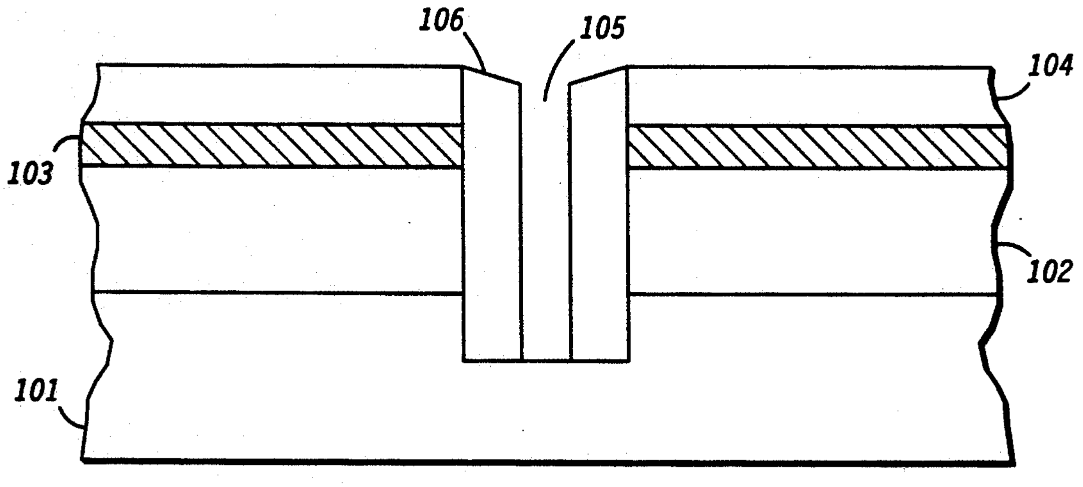
100 Fig. 1D
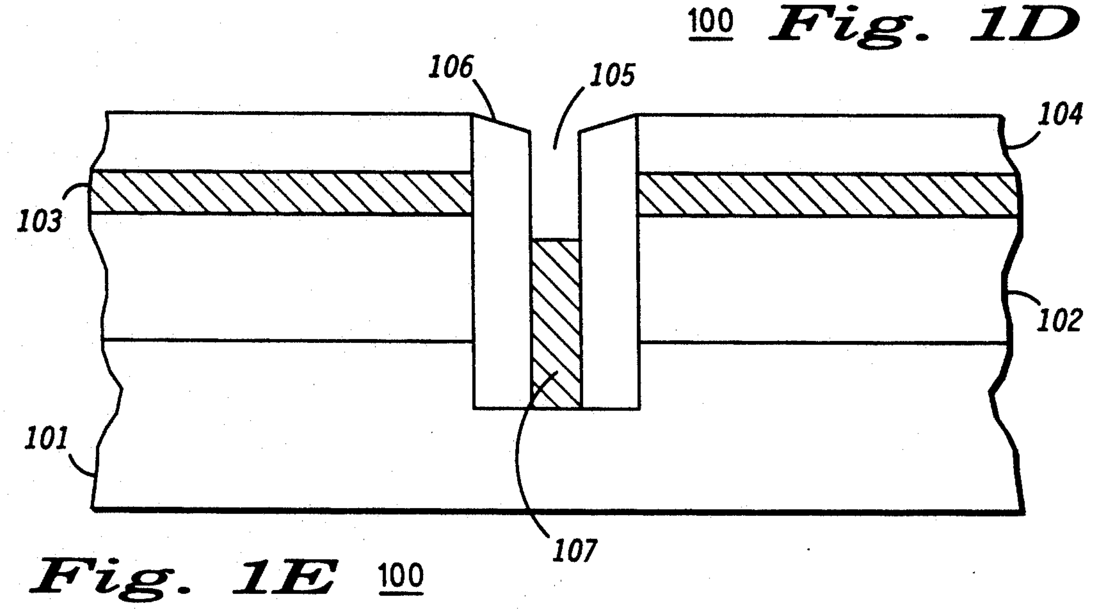
Fig. 1E 100
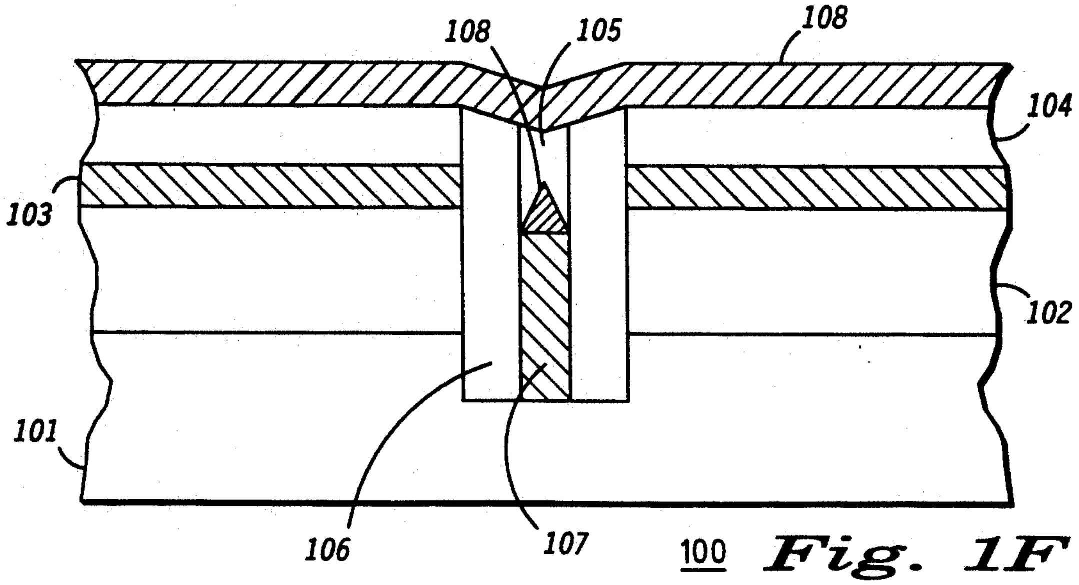
100 Fig. 1F

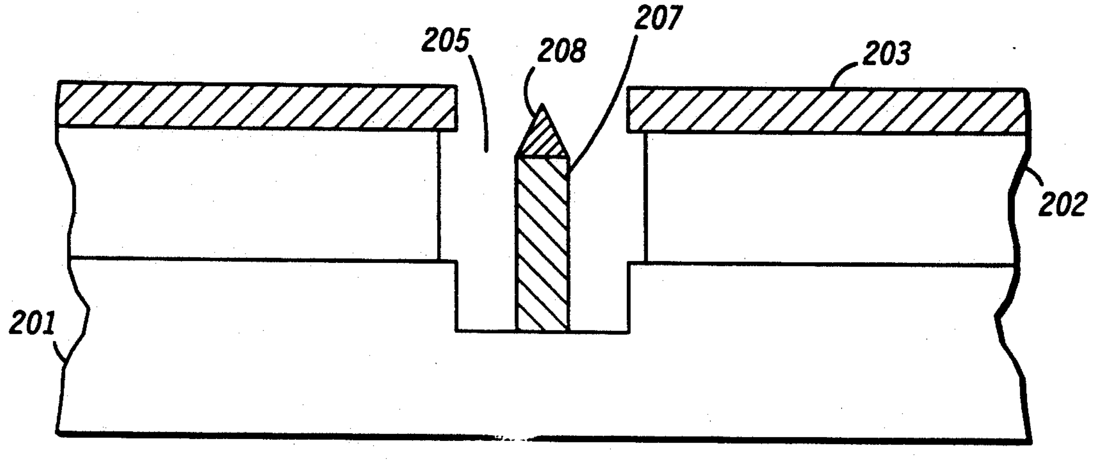
200 *Fig. 2*
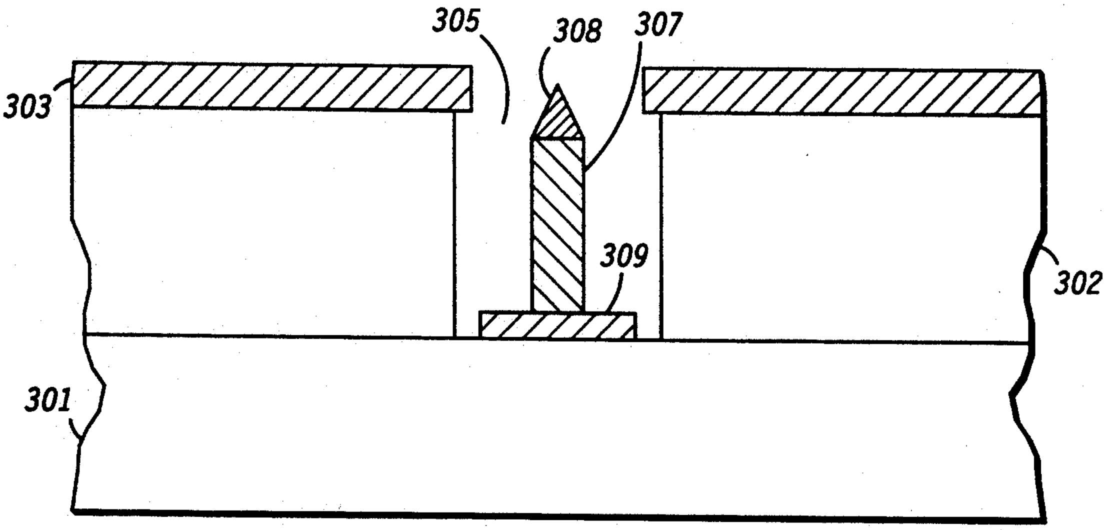
300 *Fig. 3*

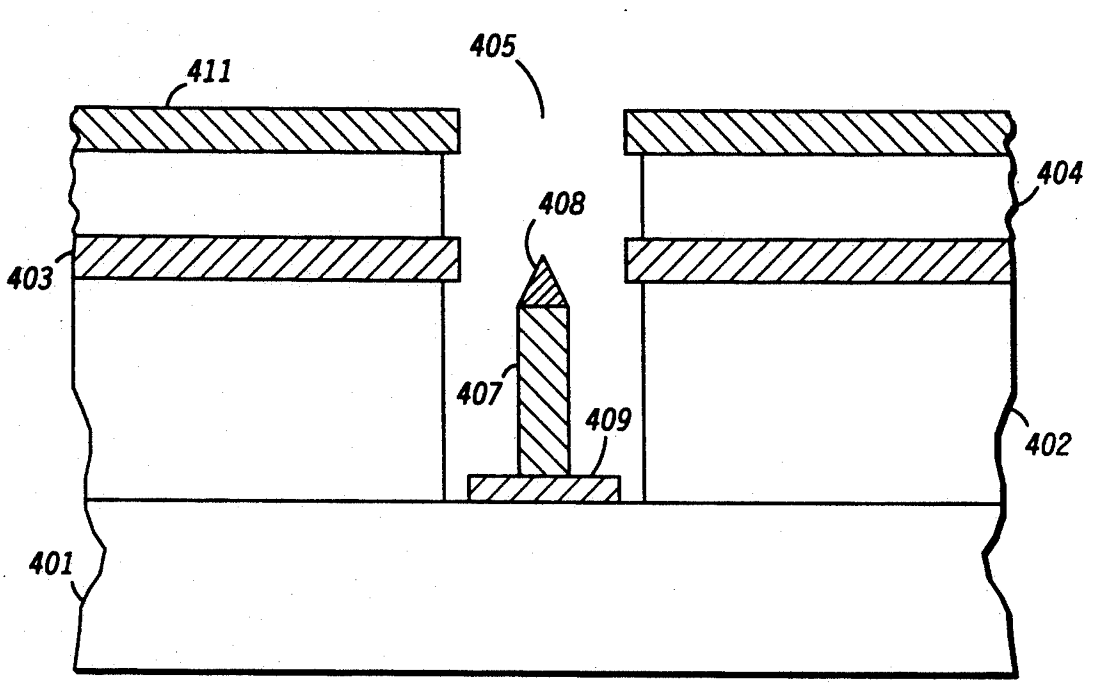
400 *Fig. 4*
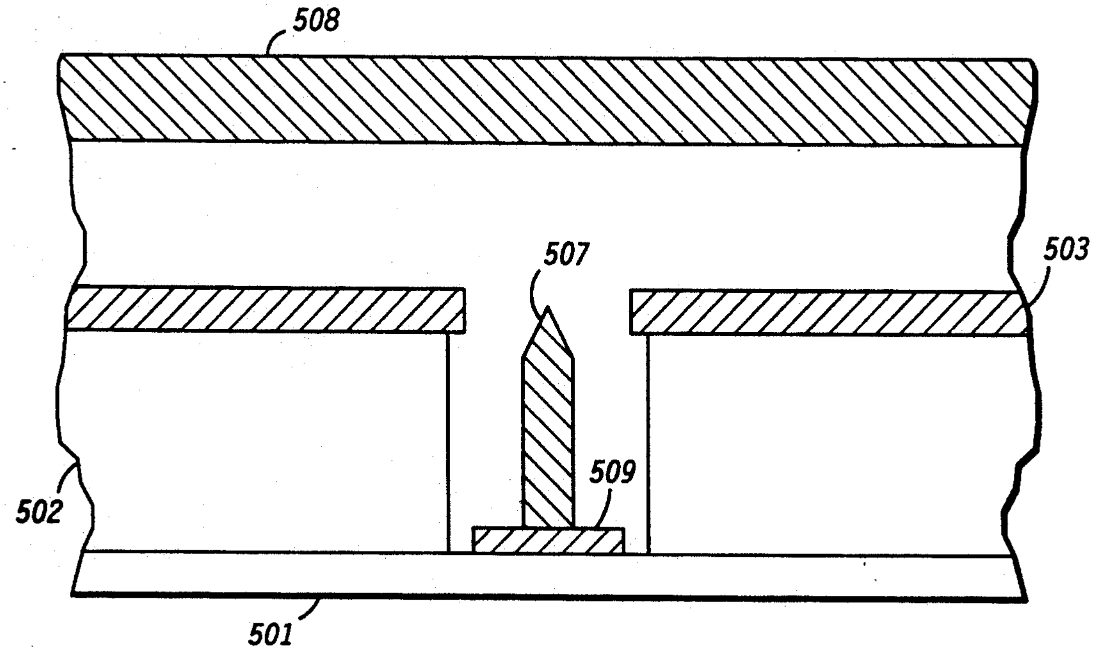
500 *Fig. 5*

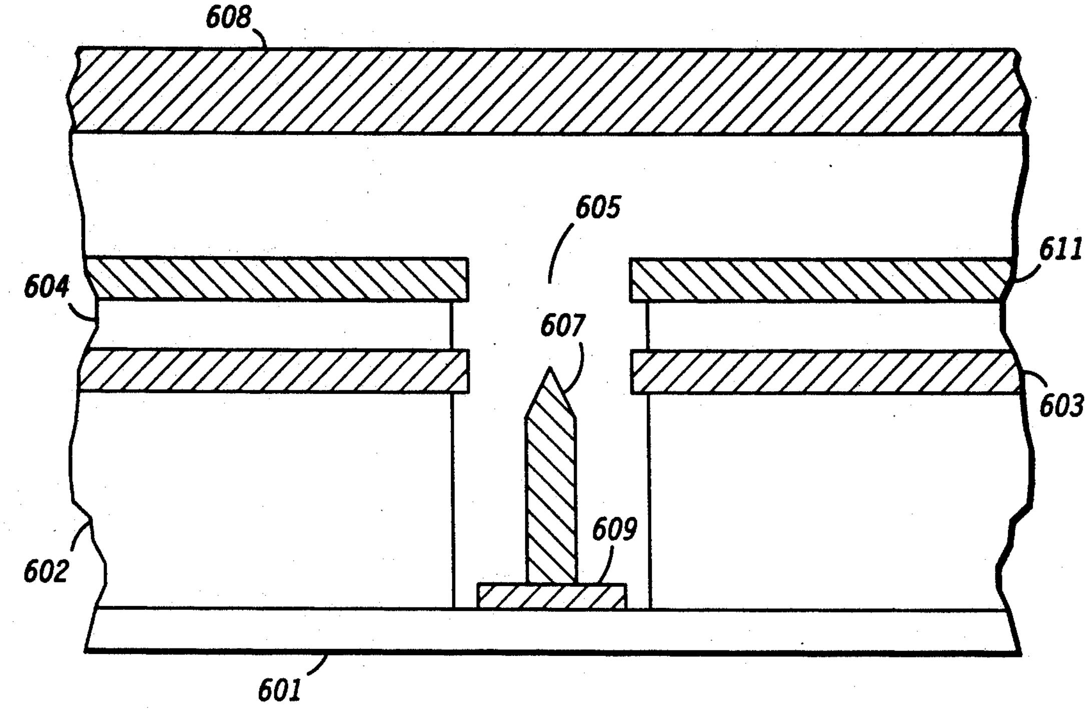
600 *Fig. 6*
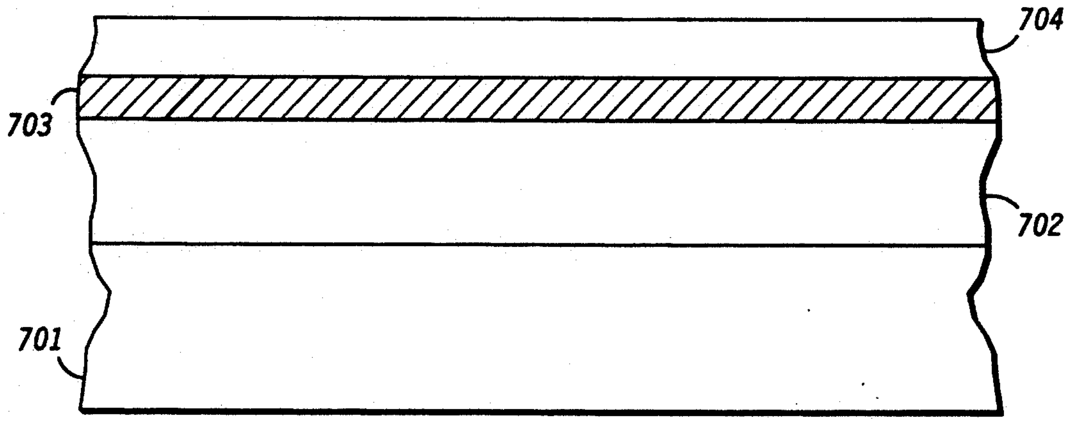
700 *Fig. 7A*

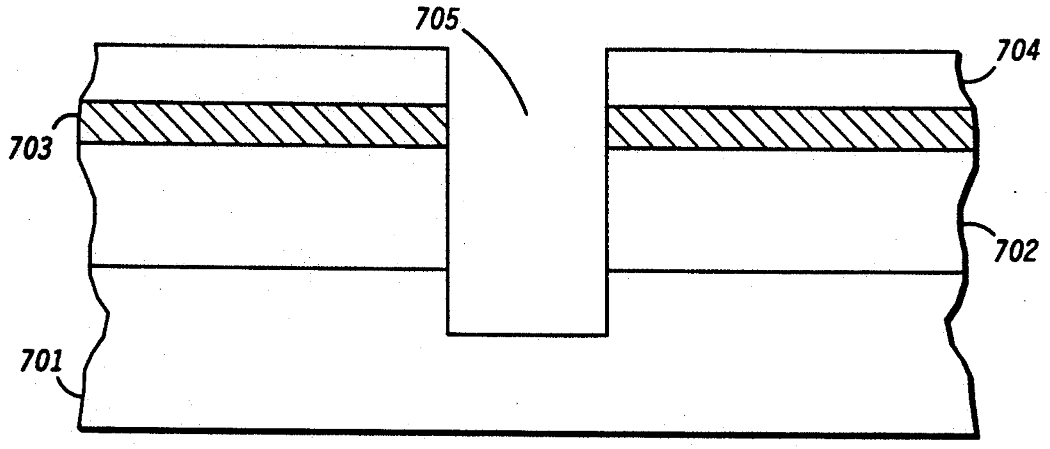
Fig. 7B 700
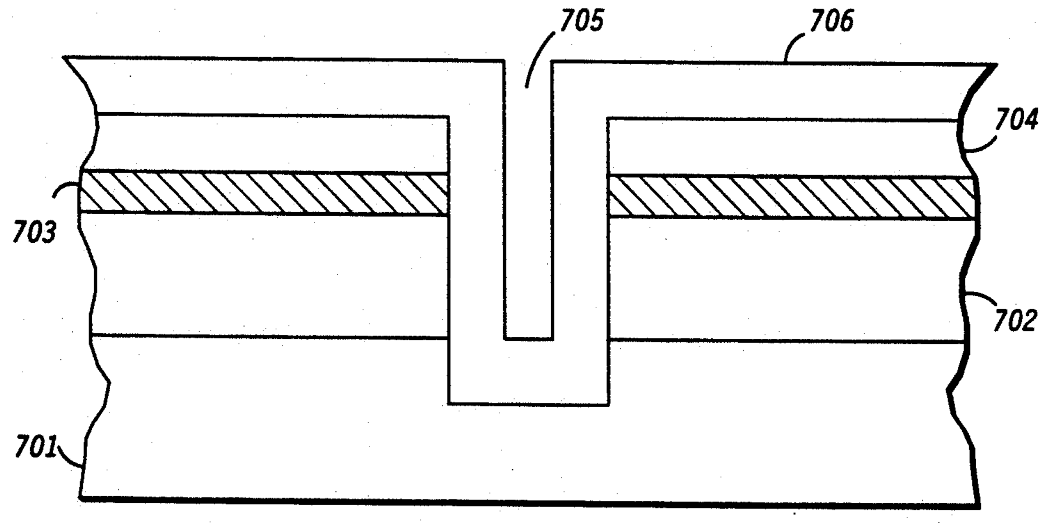
700 Fig. 7C
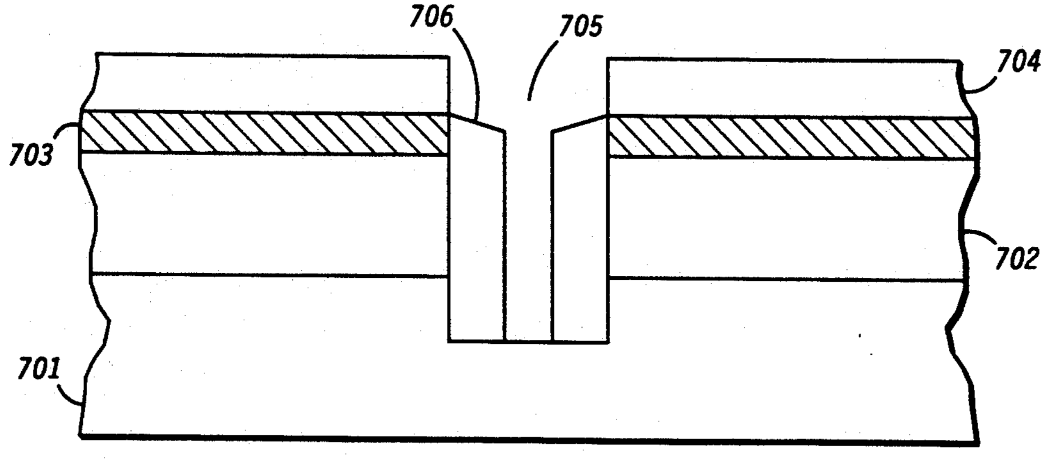
Fig. 7D 700

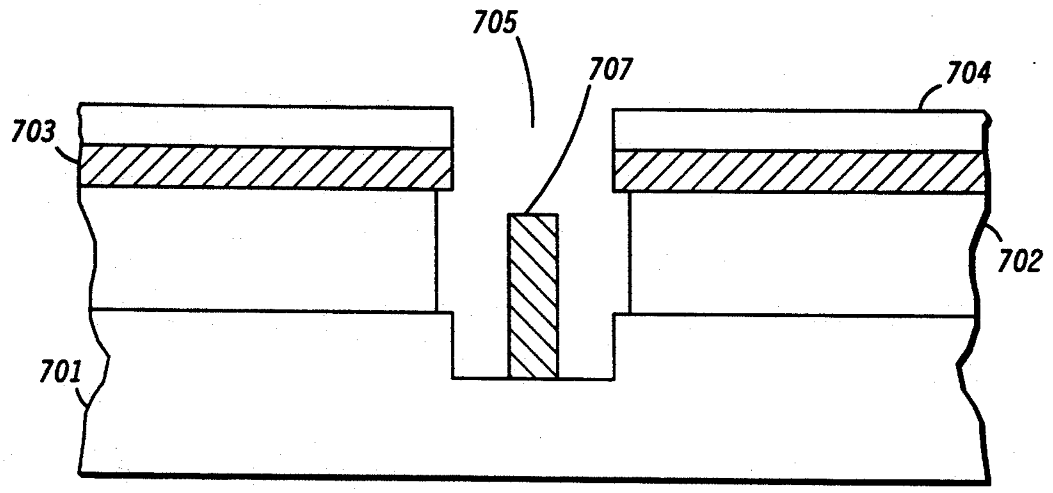
700 *Fig. 7E*
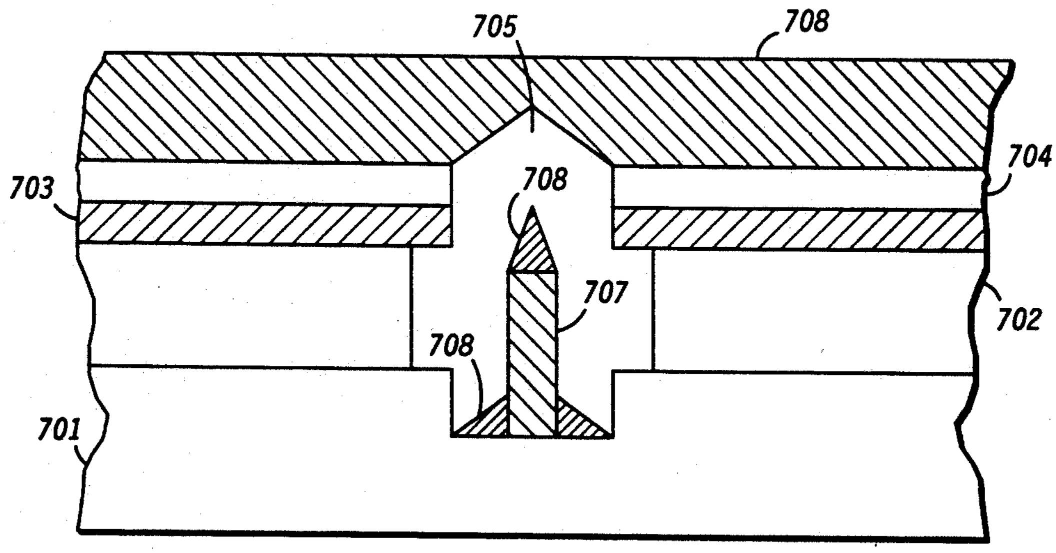
700 *Fig. 7F*

FIELD EMISSION DEVICE EMPLOYING A SELECTIVE ELECTRODE DEPOSITION METHOD

FIELD OF THE INVENTION

The present invention relates generally to cold-cathode field emission devices and more particularly to a method for realizing field emission devices.

BACKGROUND OF THE INVENTION

Field emission devices (FEDs) are known in the art and may be realized using a variety of methods some of which require complex materials deposition techniques and others which require undesirable etch steps.

Typically FEDs are comprised of an electron emitter, a gate extraction electrode, and an anode, although two element structures comprised of only an electron emitter and anode are known. In a customary application of an FED a suitable potential is applied to at least the gate extraction electrode so as to induce an electric field of suitable magnitude and polarity such that electrons may tunnel through a reduced surface potential barrier of finite extent with increased probability. Emitted electrons, those which have escaped the surface of the electron emitter electrode into free-space, are generally preferentially collected at the device anode.

Various device geometries which may be realized using the known methods include FEDs which emit electrons substantially perpendicularly with respect to a supporting substrate and other FEDs which emit electrons substantially parallel with reference to the supporting substrate. A common shortcoming of these prior art FEDs is that an optimum emitter structure, which is known to be a cylindrical column or elongated ridge, is not realizable.

Accordingly, there is a need for a field emission device and/or a method for forming a field emission device which overcomes at least some of these shortcomings of the prior art.

SUMMARY OF THE INVENTION

This need and others are substantially met through provision of a method of forming a field emission device including the steps of providing a supporting substrate having at least a first major surface; and depositing at least a first insulator layer substantially onto at least a part of the at least first major surface of the supporting substrate; and depositing at least a first conductive layer substantially disposed on at least a part of the at least first insulator layer; and providing at least a second insulator layer substantially disposed on at least a part of the at least first conductive layer; and providing a selectively patterned etch mask substantially disposed on at least a part of the at least second insulator layer; and performing a directed/anisotropic etch to remove at most a part of each of the at least first insulator layer, the at least first conductive layer, and the at least second insulator layer; and removing substantially all of any remaining mask material; and substantially conformally depositing at least a third insulator layer onto at least a part of any exposed surfaces of each of the supporting substrate, the at least first insulator layer, the at least first conductive layer, and the at least second insulator layer; and performing a directed/anisotropic etch of at most some of the at least third insulator layer; and selectively depositing at least a second layer of conductive material substantially disposed on at least a part of the at least first major surface of the supporting substrate; and performing a substantially normal deposition of an at least third layer of conductive material at least partially disposed on at least a part of the at least second layer of conductive material, such that a field emission device structure is realized being comprised of at least a first electron emitter, a gate extraction electrode formed substantially symmetrically, peripherally at least partially about the at least first electron emitter, and an anode for collecting at least some of any electrons emitted from the at least first electron emitter.

In some embodiments of an FED constructed by methods in accordance with the present invention, the FED utilizes an electron emitter including a substantially cylindrical column conductor on which a substantially conical conductor having a geometric discontinuity of small radius of curvature is disposed. In other embodiments of an FED constructed by employing methods in accordance with the present invention, the FED utilizes an electron emitter including a substantially elongated ridge on which a wedge having a geometric discontinuity of small radius of curvature is disposed.

In one embodiment of an FED constructed by a method in accordance with the present invention an encapsulated triode structure is provided comprised of an electron emitter, gate extraction electrode, and anode wherein the anode is realized as at least a part of the encapsulation layer.

In another embodiment of an FED constructed by a method in accordance with the present invention a two element structure is comprised of an electron emitter and a gate extraction electrode.

In yet another embodiment of an FED constructed by a method in accordance with the present invention a three element structure includes an electron emitter, a gate extraction electrode, and a first focusing electrode.

BRIEF DESCRIPTION OF THE DRAWINGS

FIGS. 1A–1F are side elevational cross-sectional depictions of various stages of an FED constructed in accordance with the present invention.

FIG. 2 is a side elevational cross-sectional depiction of a second embodiment of an FED realized by employing a second method in accordance with the present invention.

FIG. 3 is a side-elevational cross-sectional depiction of a third embodiment of an FED realized by employing a third method in accordance with the present invention.

FIG. 4 is a side-elevational cross-sectional depiction of a fourth embodiment of an FED realized by employing a method similar to that employed in conjunction with the embodiment of FIG. 2.

FIG. 5 is a side-elevational cross-sectional depiction of a fifth embodiment of an FED realized by employing a method similar to that employed in conjunction with the embodiment of FIG. 3.

FIG. 6 is a side-elevational cross-sectional depiction of a sixth embodiment of an FED constructed by a method similar to that used in conjunction with FIG. 4.

FIGS. 7A–7F are side elevational cross-sectional depictions of structures realized from performing various steps of another method of constructing FEDs in accordance with the present invention to form still another embodiment of an FED.

DETAILED DESCRIPTION OF A PREFERRED EMBODIMENT

Referring now to FIG. 1A there is depicted portions of a field emission device (FED) 100 including a supporting substrate 101 having a first major surface. A first insulator layer 102 is disposed on the major surface of supporting substrate 101. A first conductive layer 103 is disposed on first insulator layer 102. A second insulator layer 104, having at least first and second surfaces, is provided wherein the first surface is disposed on first conductive layer (103).

FIG. 1B depicts the portions of FED 100 illustrated in FIG. 1A after having been subjected to a selective directed/anisotropic etch step such as, for example, a reactive ion etch which preferentially selectively removes some of second insulator layer 104, first conductive layer 103, first insulator layer 102 and supporting substrate 101. The selective directed/anisotropic etch preferentially forms a cavity or groove 105 which is bounded by each of first insulator layer 102, conductive layer 103, second insulator layer 104, and supporting substrate (101). In the depiction of FIG. 1B the directed or anisotropic etch step has been carried out to the extent that some of supporting substrate 101 has been etched as well. It is entirely appropriate for many anticipated applications that the directed or anisotropic etch will be terminated without substantially removing any of supporting substrate 101.

Desired physical features of cavity 105 include, for example, a circular or elongated configuration which is realized during the directed or anisotropic etch by employing any of the many suitable etch mask techniques commonly known in the art. As part of the method presently under consideration, the etch mask (not shown) is selectively exposed, developed, and patterned such that performing subsequent steps of the method will realize cavity 105 exhibiting a desired shape. Providing a circular geometry will give rise, as a result of employing additional steps of the method of the present invention to be described, to a columnar shaped electron emitter structure. Providing an elongated (elliptic/rectangular) chamber geometry will give rise, as a result of employing additional steps of the method of the present invention to be described, to a ridge shaped electron emitter structure. It is anticipated that variations to the possibilities described will yield other cavity configurations and electron emitter structures such as, for example, serpentine cavities and emitter structures.

FIG. 1C depicts the portions of FED 100 as described previously with reference to FIG. 1B and further illustrates a third insulator layer 106 conformally disposed on the second surface of second insulator layer 104 and the exposed surface of cavity 105.

Referring now to FIG. 1D there is depicted the portions of FED 100, previously described with reference to FIG. 1C, after being subjected to a directed or anisotropic etch to remove some of third insulator layer 106 to the extent that supporting substrate 101, defining the bottom surface of cavity 105, is exposed.

FIG. 1E depicts the portions of FED 100, described previously with reference to FIG. 1D, after being subjected to further processing. In this step a selective deposition of conductive material, such as tungsten, has been deposited as a second conductive layer 107 on supporting substrate 101 within cavity 105.

FIG. 1F depicts FED 100, described previously with reference to FIG. 1E, further including a third conductive layer 108 disposed on second conductive layer 107. Third conductive layer 108 is realized by employing a substantially normal (perpendicular with reference to the supporting substrate) deposition of the conductive material of third conductive layer 108. For FED 100, the aperture diameter of cavity 105 will preferentially be relatively small, generally on the order of 1 micron or less, such that a substantially normal deposition will tend to close-over the aperture as material of third conductive layer 108 is deposited. This self-closure feature provides for a geometric discontinuity of small radius of curvature (less than 500 angstroms) in the form of a cone apex or an elongated wedge edge. The cone apex or wedge edge forms as a result of the continuously decreasing aperture of cavity 105 as the aperture closes during deposition of third conductive layer 108.

FED 100, depicted in FIG. 1F, may be employed as an encapsulated FED by providing suitable external potentials and signals to each of the conductive layers. As an example, by connecting a reference potential to supporting substrate 101 and connecting a more positive potential to first conductive layer 103, FED 100 is induced to emit electrons preferentially from a region at or near the cone apex or wedge edge. By further connecting an appropriate potential to the portion of third conductive layer 108 disposed on second insulator layer 104 at least some emitted electrons will be collected at third conductive layer 108. In this instance the potential connected to third conductive layer 108 is more positive than the reference potential connected to substrate 101. So constructed and energized by externally provided potentials or signals, FED 100 will perform as an encapsulated triode FED wherein supporting substrate 101 is operably coupled to second conductive layer 107, which is operably coupled to third conductive layer 108 to perform as the device electron emitter, first conductive layer 103 performs as the device gate extraction electrode to provide a suitable electric field at or near the cone apex or wedge edge formed in third conductive layer 108, which electric field preferentially induces electron emission from the electron emitter, and third conductive layer 108 disposed on second insulator layer 104 performs as a device anode to collect at least some emitted electrons.

FIG. 2 depicts a FED 200 similar to FED 100 previously described with reference to FIG. 1F. Portions of FED 200 which are the same as portions of FED 100 are designated with a similar number but have a "2" prefix to indicate a different embodiment. FED 200 has undergone further processing wherein substantially all of second insulator layer 204 has been removed and by so doing substantially all of third conductive layer 208, except that disposed on second conductive layer 207, has also been removed. In FIG. 2 substantially all of third insulator layer 206 has been removed.

In one embodiment, FED 200 is employed as a two element FED wherein externally provided potentials or signals are utilized to induce electron emission from the electron emitter. For this embodiment, emitted electrons are collected at first conductive layer 203 with first conductive layer 203 serving as both the gate extraction electrode and the device anode. Alternatively, a separately provided device anode (not depicted) to be described below may be employed to collect at least some emitted electrons.

Referring now to FIG. 3 there is depicted a FED 300, similar to FED 200. Portions of FED 300 which are the same as portions of FED 200 are designated with a similar number but have a "3" prefix to indicate a different embodiment. FED 300 includes, in addition to the structure illustrated in FIG. 2, a first selectively patterned conductive layer 309 disposed on the surface of substrate 301. In this specific embodiment, first selectively patterned conductive layer 309 is constructed in accordance with the following steps: providing a supporting substrate 301 having a major surface; depositing a first selectively patterned conductive layer 309 on the major surface of supporting substrate 301; depositing a first insulator layer 302 on any exposed part of the major surface of supporting substrate 301 and first conductive layer 309; depositing a second conductive layer 303 on first insulator layer 302; providing a second insulator layer (304, not shown) on the second conductive layer; providing a selectively patterned etch mask on the second insulator layer; and performing a directed or anisotropic etch, using the selectively patterned etch mask, to remove part of each of first insulator layer 309, second conductive 303, and second insulator layer 304 and form a cavity 305 therethrough at least to first conductive layer 309. In an alternative embodiment (not shown) it is anticipated that a selectively patterned conductive layer may be realized as an implantation of ions into supporting substrate 301. First selectively patterned conductive layer 309, which is coupled to second conductive layer 307, is utilized to connect an externally provided signal or potential to FED 300 to effect device operation. First selectively patterned conductive layer 309 is, for example, a highly doped area utilized to improve the electrical connection to second conductive layer 307. Applying suitable externally provided potentials or signals to first conductive layer 303 (gate extraction electrode) and first selectively patterned conductive layer 309 which is part of the FED electron emitter structure permits operation of the FED as described previously with reference to FIG. 2.

FIG. 4 is a depiction of an FED 400, similar to FED 300 in FIG. 3. Portions of FED 400 which are the same as portions of FED 300 are designated with a similar number but have a "4" prefix to indicate a different embodiment. Constructing FED 400 further includes the process step of providing an additional conductive layer. As depicted, a second insulator layer 404 is disposed on first conductive layer 403. A second conductive layer 411 is disposed on second insulator layer 404. The steps of providing second conductive layer 411 and second insulator layer 404 are performed prior to the directed or anisotropic etch step which is employed to form cavity 405. A third conductive layer 407 and a fourth conductive layer 408 are provided. FEDs 400 constructed by employing this method in accordance with the present invention are devices having desired pluralities of gate extraction electrodes, electron focusing electrodes, etc.

Referring now to FIG. 5 there is depicted an FED 500 constructed by employing some of the steps described previously with reference to FIG. 3 and further including an anode 508 distally disposed with reference to an electron emitter 507. Anode 508, provided to collect some emitted electrons, is constructed of conductive material, such as metallic materials. Alternatively, anode 508 is constructed of a plurality of material layers (not shown) such as a substantially optically transparent faceplate, a substantially optically transparent conductor, and a cathodoluminescent material (commonly referred to as a phosphor) to function as a display screen.

FIG. 6 depicts an FED 600 constructed by employing the method described previously with reference to FIG. 4 and further including an anode 608 distally disposed with reference to an electron emitter 607. Anode 608, provided to collect emitted electrons, is constructed of conductive material such as metallic materials. Alternatively, anode 608 includes a plurality of material layers such as a substantially optically transparent faceplate, a substantially optically transparent conductor, and a cathodoluminescent material (commonly referred to as a phosphor) to function as a display screen.

FIGS. 7A through 7F illustrate the steps of another method in accordance with the present invention which may be employed to realize another embodiment wherein a substantially normal column or ridge is formed as a part of an electron emitter.

Referring now to FIG. 7A portions of a FED 700 are depicted including a supporting substrate 701 and a first insulator layer 702, a first conductor layer 703, and a second insulator layer 704 have been realized by a plurality of material depositions.

FIG. 7B depicts the portions of FED 700 described previously with reference to FIG. 7A having undergone an additional process step of directed or anisotropic etch to form a cavity 705 as described previously with reference to FIG. 1B.

FIG. 7C depicts the portions of FED 700 described previously with reference to FIG. 7B having undergone an additional process step wherein a third insulator layer 706 has been conformally deposited. In FED 700 the material of third insulator layer 706 is preferentially selected to exhibit substantially the same etch characteristics as those of first insulator layer 702.

FIG. 7D depicts the portions of FED 700 described previously with reference to FIG. 7C having undergone an additional processing step wherein a part of third insulator layer 706 has been removed.

FIG. 7E depicts the portions of FED 700 described previously with reference to FIG. 7D having undergone additional process steps wherein a second conductive layer 707 has been deposited in cavity 705 and the remaining part of third insulator layer 706 has been removed. Further, FIG. 7E illustrates that second insulator layer 704 remains substantially un-affected as a result of selecting a material for second insulator layer 704 which exhibits a high etch discrimination ratio over that of first and second insulator layers 706 and 702.

FIG. 7F depicts the portions of FED 700 described previously with reference to FIG. 7E having undergone an additional process step wherein a third conductive layer 708 has been deposited on the exposed surfaces as described previously with reference to FIG. 1F. In FED 700 the columnar or ridge structure depicted, having a cone or wedge disposed thereon, respectively, as part of third conductive layer 708, is substantially free-standing since third insulator layer 706 is removed.

FED 700 is a device wherein the electron emission will have a reduced probability of charging any insulator material of any of the insulator layers which may be proximally disposed in relation to the cone apex or wedge edge of the emitter. It is anticipated that FED 700 may further include a selectively patterned conductive layer as described previously with reference to FIG. 3.

FEDs realized as a result of performing the described manufacturing methods in accordance with the present invention provide a substantially columnar or ridge structure whereon a conductive layer exhibiting a geometric discontinuity of small radius of curvature is disposed. Columnar or ridge electron emitters provide improved electric field characteristics at or near the emitting cone apex or wedge edge which significantly improves FED performance. Further, as a result of the described manufacturing methods, the gate extraction electrode(s) and any focusing electrodes are substantially symmetrically disposed with reference to the electron emitter electrode. The described manufacturing methods provide for self alignment of the gate extraction electrode(s) and any focusing electrodes with the electron emitter electrode.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What we claim is:

1. A method of forming a field emission device including the steps of:
- providing a supporting substrate having a major surface;
- depositing a first insulator layer on the major surface of the supporting substrate;
- depositing a first conductive layer on the first insulator layer;
- providing a second insulator layer on the first conductive layer;
- providing a selectively patterned etch mask on the second insulator layer;
- performing a directed or anisotropic etch on areas not masked by the selectively patterned etch mask to remove part of each of the first insulator layer, the first conductive layer, and the second insulator layer to define a cavity therethrough to the supporting substrate;
- removing the remaining selectively patterned etch mask;
- substantially conformally depositing a third insulator layer onto any exposed surfaces of each of the supporting substrate, the first insulator layer, the first conductive layer, and the second insulator layer;
- performing a directed or anisotropic etch of the third insulator layer to remove the third insulator layer covering the supporting substrate within the cavity;
- selectively depositing a second layer of conductive material on the exposed major surface of the supporting substrate within the cavity so as to form a first substantially cylindrical column within the cavity; and
- performing a substantially normal deposition of a third layer of conductive material on the second layer of conductive material in the cavity to provide a substantially conically shaped layer of material disposed on the first substantially cylindrical column, such that a field emission device structure is realized including an electron emitter, a gate extraction electrode, and an anode.

2. A method of forming a field emission device including the steps of:
- providing a supporting substrate having a major surface;
- depositing a first insulator layer on the major surface of the supporting substrate;
- depositing a first conductive layer on the first insulator layer;
- providing a second insulator layer on the first conductive layer;
- providing a selectively patterned etch mask on the second insulator layer;
- performing a directed or anisotropic etch on areas not masked by the selectively patterned etch mask to remove part of each of the first insulator layer, the first conductive layer, and the second insulator layer to define a cavity therethrough to the supporting substrate;
- removing the remaining selectively patterned etch mask;
- substantially conformally depositing a third insulator layer onto any exposed surfaces of each of the supporting substrate, the first insulator layer, the first conductive layer, and the second insulator layer;
- performing a directed or anisotropic etch of the third insulator layer to remove the third insulator layer covering the supporting substrate within the cavity;
- selectively depositing a second layer of conductive material on the exposed major surface of the supporting substrate within the cavity so as to form a first substantially elongated ridge within the cavity; and
- performing a substantially normal deposition of a third layer of conductive material on the second layer of conductive material in the cavity to provide a substantially wedge shaped layer of material disposed on the first substantially elongated ridge, such that a field emission device structure is realized including an electron emitter, a gate extraction electrode, and an anode.

3. A method of forming a field emission device including the steps of:
- providing a supporting substrate having a major surface;
- depositing a first selectively patterned conductive layer on the major surface of the supporting substrate;
- depositing a first insulator layer on any exposed part of the major surface of the supporting substrate and the first conductive layer;
- depositing a second conductive layer on the first insulator layer;
- providing a second insulator layer on the second conductive layer;
- providing a selectively patterned etch mask on the second insulator layer;
- performing a directed or anisotropic etch, using the selectively patterned etch mask, to remove part of each of the first insulator layer, the second conductive layer, and the second insulator layer and form a cavity therethrough at least to the first conductive layer;
- removing the remaining selectively patterned etch mask;
- substantially conformally depositing a third insulator layer onto any exposed surfaces of each of the supporting substrate, the first selectively patterned conductive layer, the first insulator layer, the second conductive layer, and the second insulator layer;

performing a directed or anisotropic etch of the third insulator layer to leave only sides of the cavity covered by the third insulator layer and an exposed surface of the first selectively patterned conductive layer within the cavity;

selectively depositing a third layer of conductive material on the first selectively patterned conductive layer within the cavity so as to form a first substantially elongated ridge within the cavity; and performing a substantially normal deposition of a fourth layer of conductive material on exposed surfaces of the device, including the third layer of conductive material to provide a substantially wedge shaped layer of material disposed on the first substantially elongated ridge, such that a field emission device structure is realized including an electron emitter, a gate extraction electrode, and an anode.

4. A method of forming a field emission device including the steps of:

providing a supporting substrate having a major surface;

depositing a first insulator layer on the major surface of the supporting substrate;

depositing a first conductive layer on the first insulator layer;

providing a second insulator layer on the first conductive layer;

providing a selectively patterned etch mask on the second insulator layer;

performing a directed or anisotropic etch, using the selectively patterned etch mask, to remove part of each of the first insulator layer, the first conductive layer, and the second insulator layer to form a cavity extending to at least the major surface of the supporting substrate;

removing the remaining selectively patterned etch mask;

substantially conformally depositing a third insulator layer on any exposed surfaces of each of the supporting substrate, the first insulator layer, the first conductive layer, and the second insulator layer;

performing a directed or anisotropic etch of the third insulator layer to expose the supporting substrate within the cavity;

selectively depositing a second layer of conductive material on the exposed supporting substrate within the cavity so as to form a first substantially elongated ridge within the cavity;

performing a substantially normal deposition of a third layer of conductive material on the second layer of conductive material to provide a substantially wedge shaped layer of material disposed on the first substantially elongated ridge, removing the second insulator layer; and removing at least some of the remaining part of the third insulator layer, such that a field emission device structure is realized including an electron emitter and a gate extraction electrode formed substantially symmetrically, peripherally at least partially about the electron emitter.

5. A method of forming a field emission device including the steps of:

providing a supporting substrate having a major surface;

depositing a first selectively patterned conductive layer on the major surface of the supporting substrate;

depositing a first insulator layer on the exposed parts of the major surface of the supporting substrate;

depositing a second conductive layer on the first insulator layer;

providing a second insulator layer on the second conductive layer;

providing a selectively patterned etch mask on the second insulator layer;

performing a directed or anisotropic etch, using the selectively patterned etch mask, to remove part of each of the first insulator layer, the second conductive layer, and the second insulator layer to form a cavity therethrough to at least the major surface of the supporting substrate;

removing the remaining selectively patterned etch mask;

substantially conformally depositing a third insulator layer on any exposed surfaces of each of the supporting substrate, the first selectively patterned conductive layer, the first insulator layer, the second conductive layer, and the second insulator layer;

performing a directed or anisotropic etch of the third insulator layer to expose the first selectively patterned conductive layer within the cavity;

selectively depositing a third layer of conductive material on the exposed first selectively patterned conductive layer within the cavity so as to form a substantially elongated ridge within the cavity;

performing a substantially normal deposition of a fourth layer of conductive material on the third layer of conductive material within the cavity to form a substantially wedge shaped layer of material on the substantially elongated ridge;

removing the second insulator layer; and removing the remaining part of the third insulator layer to form a field emission device including an electron emitter and a gate extraction electrode.

6. A method of forming a field emission device including the steps of:

providing a supporting substrate having a major surface;

depositing a first selectively patterned conductive layer on the major surface of the supporting substrate;

depositing a first insulator layer on any exposed part of the major surface of the supporting substrate and the first conductive layer;

depositing a second conductive layer on the first insulator layer;

providing a second insulator layer on the second conductive layer;

providing a selectively patterned etch mask on the second insulator layer;

performing a directed or anisotropic etch, using the selectively patterned etch mask, to remove part of each of the first insulator layer, the second conductive layer, and the second insulator layer and form a cavity therethrough at least to the first conductive layer;

removing the remaining selectively patterned etch mask;

substantially conformally depositing a third insulator layer onto any exposed surfaces of each of the supporting substrate, the first selectively patterned conductive layer, the first insulator layer, the second conductive layer, and the second insulator layer;

performing a directed or anisotropic etch of the third insulator layer to leave only sides of the cavity covered by the third insulator layer and an exposed surface of the first selectively patterned conductive layer within the cavity;

selectively depositing a third layer of conductive material on the first selectively patterned conductive layer within the cavity so as to form a first substantially cylindrical column within the cavity; and performing a substantially normal deposition of a fourth layer of conductive material on exposed surfaces of the device, including the third layer of conductive material to provide a substantially conically shaped layer of material disposed on the first substantially cylindrical column, such that a field emission device structure is realized including an electron emitter, a gate extraction electrode, and an anode.

7. The method of claim 6 wherein a field emission device is formed by the layers of conductive material, including an electron emitter and a gate extraction electrode formed substantially symmetrically, peripherally at least partially about the electron emitter.

8. A method of forming a field emission device including the steps of:

providing a supporting substrate having a major surface;

depositing a first insulator layer on the major surface of the supporting substrate;

depositing a first conductive layer on the first insulator layer;

providing a second insulator layer on the first conductive layer;

providing a selectively patterned etch mask on the second insulator layer;

performing a directed or anisotropic etch, using the selectively patterned etch mask, to remove part of each of the first insulator layer, the first conductive layer, and the second insulator layer to form a cavity extending to at least the major surface of the supporting substrate;

removing the remaining selectively patterned etch mask;

substantially conformally depositing a third insulator layer on any exposed surfaces of each of the supporting substrate, the first insulator layer, the first conductive layer, and the second insulator layer;

performing a directed or anisotropic etch of the third insulator layer to expose the supporting substrate within the cavity;

selectively depositing a second layer of conductive material on the exposed supporting substrate within the cavity so as to form a first substantially cylindrical column within the cavity;

performing a substantially normal deposition of a third layer of conductive material on the second layer of conductive material to provide a substantially conically shaped layer of material disposed on the first substantially cylindrical column, removing the second insulator layer; and removing at least some of the remaining part of the third insulator layer, such that a field emission device structure is realized including an electron emitter and a gate extraction electrode formed substantially symmetrically, peripherally at least partially about the electron emitter.

9. A method of forming a field emission device including the steps of:

providing a supporting substrate having a major surface;

depositing a first selectively patterned conductive layer on the major surface of the supporting substrate;

depositing a first insulator layer on the exposed parts of the major surface of the supporting substrate;

depositing a second conductive layer on the first insulator layer;

providing a second insulator layer on the second conductive layer;

providing a selectively patterned etch mask on the second insulator layer;

performing a directed or anisotropic etch, using the selectively patterned etch mask, to remove part of each of the first insulator layer, the second conductive layer, and the second insulator layer to form a cavity therethrough to at least the major surface of the supporting substrate;

removing the remaining selectively patterned etch mask;

substantially conformally depositing a third insulator layer on any exposed surfaces of each of the supporting substrate, the first selectively patterned conductive layer, the first insulator layer, the second conductive layer, and the second insulator layer;

performing a directed or anisotropic etch of the third insulator layer to expose the first selectively patterned conductive layer within the cavity;

selectively depositing a third layer of conductive material on the exposed first selectively patterned conductive layer within the cavity so as to form a substantially cylindrical column within the cavity;

performing a substantially normal deposition of a fourth layer of conductive material on the third layer of conductive material within the cavity to form a substantially conically shaped layer of material on the substantially cylindrical column;

removing the second insulator layer; and removing the remaining part of the third insulator layer to form a field emission device including an electron emitter and a gate extraction electrode.

* * * * *